(12) United States Patent
Nishi

(10) Patent No.: US 11,552,002 B2
(45) Date of Patent: Jan. 10, 2023

(54) SEMICONDUCTOR DEVICE

(71) Applicant: Mitsubishi Electric Corporation, Tokyo (JP)

(72) Inventor: Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 17/227,213

(22) Filed: Apr. 9, 2021

(65) Prior Publication Data

US 2022/0013437 A1    Jan. 13, 2022

(30) Foreign Application Priority Data

Jul. 10, 2020  (JP) .............................. JP2020-118861

(51) Int. Cl.
*H01L 23/482* (2006.01)
*H01L 29/10* (2006.01)
(Continued)

(52) U.S. Cl.
CPC ...... *H01L 23/4824* (2013.01); *H01L 29/0696* (2013.01); *H01L 29/1095* (2013.01);
(Continued)

(58) Field of Classification Search
CPC ............. H01L 23/4824; H01L 29/0696; H01L 29/1095; H01L 29/407; H01L 29/41708; H01L 29/7397
(Continued)

(56) References Cited

U.S. PATENT DOCUMENTS

2003/0178673 A1    9/2003  Bhalla et al.
2010/0019314 A1*   1/2010  Kachi ................. H01L 29/7811
                                                  257/E21.585
(Continued)

FOREIGN PATENT DOCUMENTS

DE    10 2019 215 127 A1    4/2020
JP         2003-309263 A   10/2003
(Continued)

OTHER PUBLICATIONS

Office Action issued in DE 10 2021 114 173.7; mailed by the German Patent and Trade Mark Office dated Jun. 27, 2022.

*Primary Examiner* — Igwe U Anya
(74) *Attorney, Agent, or Firm* — Studebaker & Brackett PC

(57) ABSTRACT

Provided is a semiconductor device in which the reliability of the gate insulating film in a trench gate is improved. The semiconductor device includes a semiconductor substrate, a plurality of trench gates, and a gate electrode. The semiconductor substrate includes an active region and a wiring region. The trench gates extend from the first active region to the wiring region. The trench gates form parts of transistors in the active region. The gate electrode is provided in the wiring region and is electrically connected to the trench gates. The end portions of the trench gates are located in the wiring region. The gate electrode is provided so as to cover gate contact portions formed at the end portions of the trench gates. The gate electrode is electrically connected to trench gates via the gate contact portions. The plurality of trench gates extend only in one direction.

14 Claims, 13 Drawing Sheets

(51) Int. Cl.
*H01L 29/739* (2006.01)
*H01L 29/417* (2006.01)
*H01L 29/40* (2006.01)
*H01L 29/06* (2006.01)

(52) U.S. Cl.
CPC ...... *H01L 29/407* (2013.01); *H01L 29/41708* (2013.01); *H01L 29/7397* (2013.01)

(58) Field of Classification Search
USPC ........................................................ 257/139
See application file for complete search history.

(56) References Cited

U.S. PATENT DOCUMENTS

| | | |
|---|---|---|
| 2010/0123187 A1 | 5/2010 | Burke et al. |
| 2014/0091387 A1 | 4/2014 | Kobayashi |
| 2020/0126973 A1 | 4/2020 | Kamibaba |
| 2020/0243641 A1* | 7/2020 | Nakagawa ............ H01L 29/083 |
| 2021/0020754 A1* | 1/2021 | Nakazawa ............ H01L 29/165 |

FOREIGN PATENT DOCUMENTS

| | | |
|---|---|---|
| JP | 2014-072412 A | 4/2014 |
| JP | 2017-010975 A | 1/2017 |
| JP | 2017-147431 A | 8/2017 |

* cited by examiner

F I G. 1
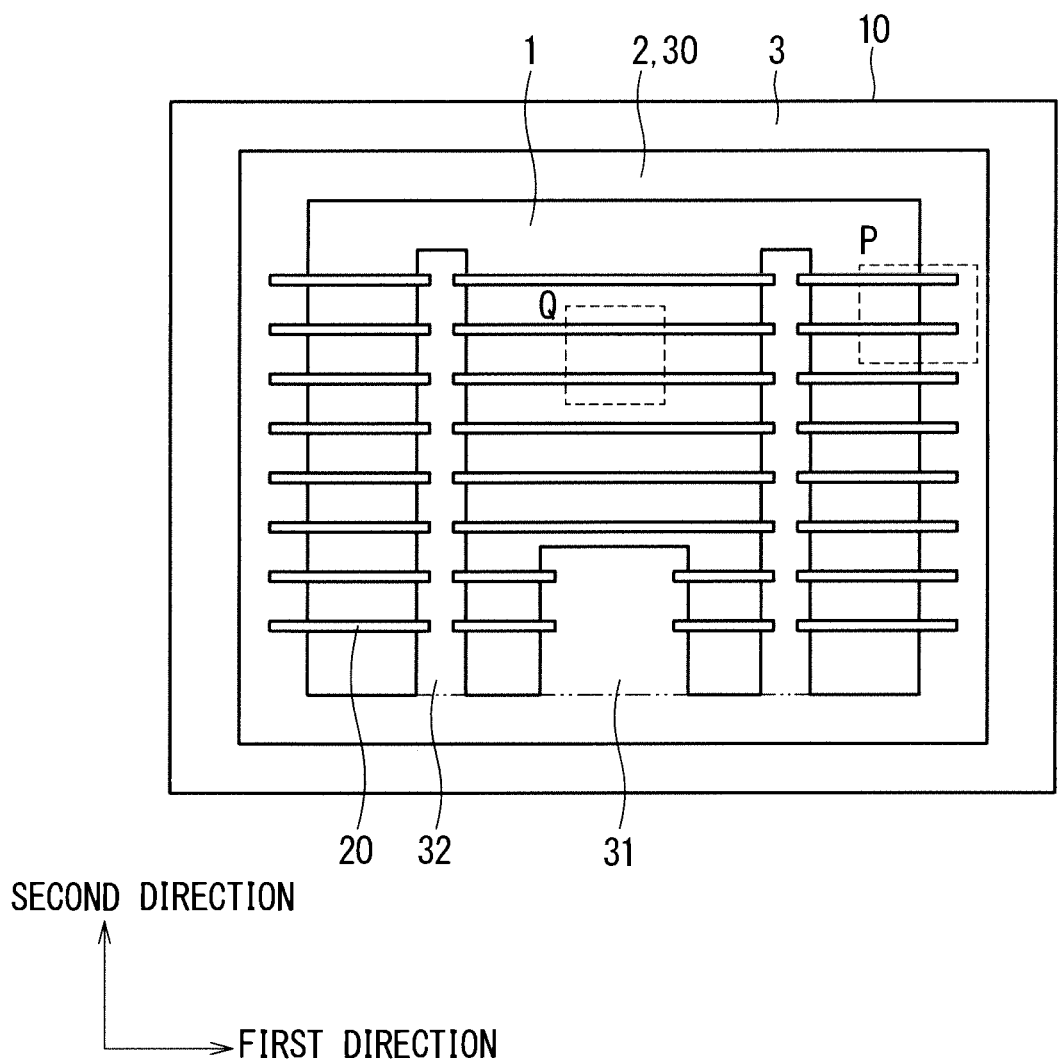

AA' CROSS SECTION

BB' CROSS SECTION

CC' CROSS SECTION

AA' CROSS SECTION

BB' CROSS SECTION

CC' CROSS SECTION

DD' CROSS SECTION

SEMICONDUCTOR DEVICE

BACKGROUND OF THE INVENTION

Field of the Invention

The present disclosure relates to a semiconductor device.

Description of the Background Art

In the fields of general-purpose inverters, AC servos, etc., Insulated Gate Bipolar Transistors (IGBTs), diodes, etc. are used for power modules that control the variable speed of three-phase motors from the viewpoint of energy saving. These IGBTs and diodes are required to have low switching loss and low on-voltage characteristics in order to reduce inverter loss.

Trench gate type IGBTs are devices with low on-voltage characteristics. In a trench gate type IGBT, the shape of an end or bottom portion of a trench is a factor that is crucial to determine the reliability of the gate insulating film. Japanese Patent Application Laid-Open No. 2003-309263 and Japanese Patent Application Laid-Open No. 2014-72412 disclose a structure in which a gate contact is formed on a conductor buried in the trench in order to improve the reliability of the gate insulating film at the end portion of the trench.

When a plurality of trench gates are provided so as to intersect each other in an active region where the transistor is formed, an opening at the intersection of the trenches is greater than an opening at a straight portion between the intersections. Therefore, when the trench is formed by etching, the depth of the intersection becomes deeper than the surrounding depth due to a micro-loading effect. As a result, a level difference is formed at the bottom of the trench, and the reliability of the gate insulating film lowers.

SUMMARY

In present disclosure, provided is a semiconductor device in which the reliability of the gate insulating film in a trench gate is improved.

The semiconductor device according to the present disclosure includes a semiconductor substrate, a plurality of trench gates, and a gate electrode. The semiconductor substrate includes the active region in which a plurality of transistors are provided and the wiring region surrounding the active region in plan view. The plurality of trench gates extend from the active region to the wiring region on a front surface of the semiconductor substrate. The plurality of trench gates form part of the plurality of transistors in the active region. The gate electrode is provided in the wiring region and is electrically connected to the plurality of trench gates. An end portion of each of the plurality of trench gates is located in the wiring region. The gate electrode is provided so as to cover a gate contact portion formed at the end portion of each of the plurality of trench gates. The gate electrode is electrically connected to each of the plurality of trench gates via the gate contact portion. The plurality of trench gates extend only in one direction on the front surface of the semiconductor substrate.

According to the semiconductor device of the present disclosure, the reliability of the gate insulating film in a trench gate is improved.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view illustrating a configuration of a semiconductor device according to Embodiment 1;

DESCRIPTION OF THE PREFERRED EMBODIMENTS

Embodiment 1

FIG. 1 is a plan view illustrating a configuration of a semiconductor device according to Embodiment 1.

Figure 2:
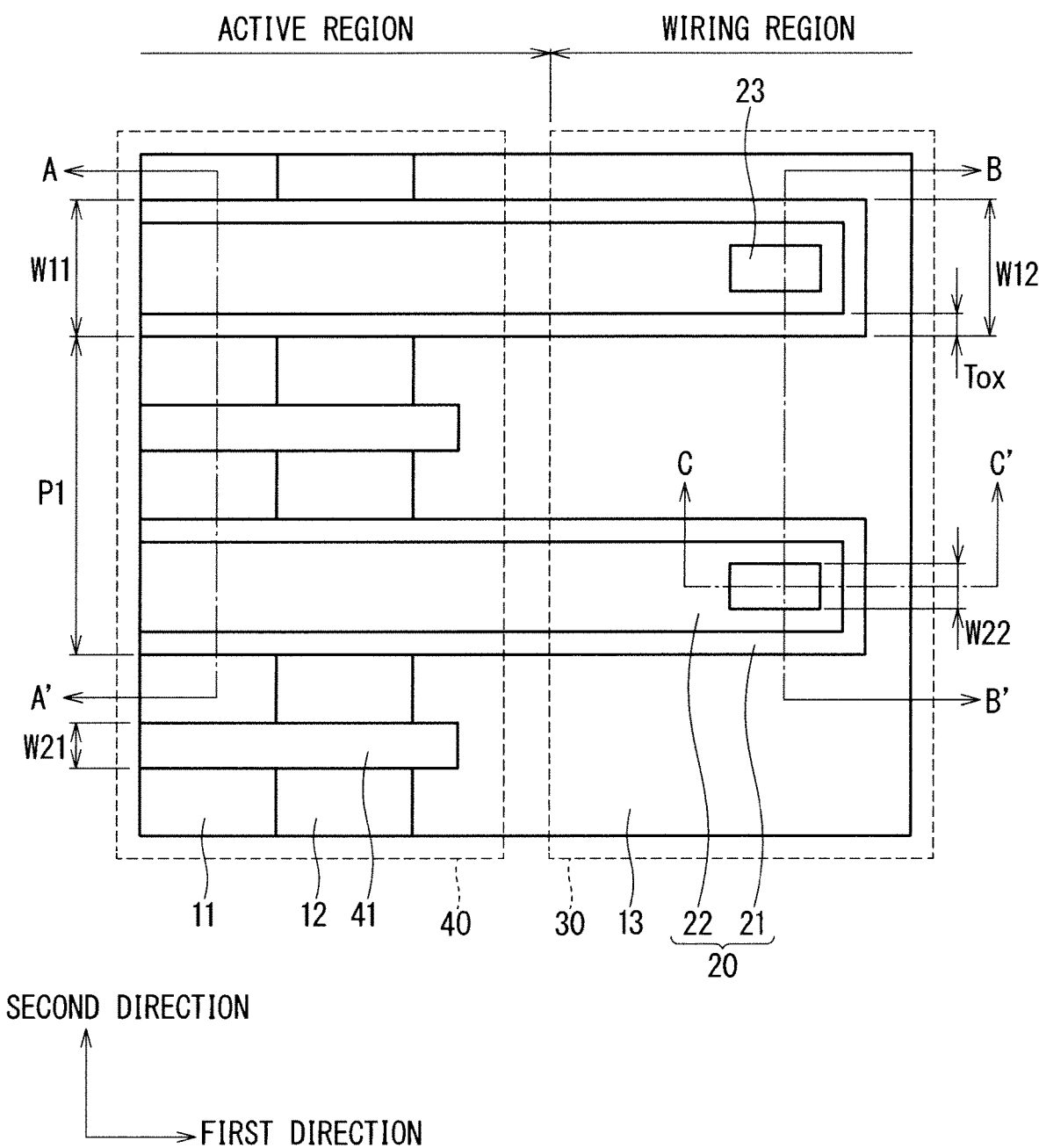
FIG. 2 is a plan view illustrating the configuration of the semiconductor device according to Embodiment 1.

The semiconductor device includes a semiconductor substrate 10, a plurality of trench gates 20, a gate electrode 30, a gate pad 31, and finger wiring portions 32. Further, although not illustrated in FIG. 1, the semiconductor device includes an emitter electrode 40 as illustrated in FIG. 2 described later.

A semiconductor substrate 10 includes an active region 1, a wiring region 2, and a terminal region 3 in plan view. The active region 1 is a region in which a plurality of transistors are provided. The transistor in Embodiment 1 is an Insulated Gate Bipolar Transistor (IGBT). The wiring region 2 is provided so as to surround the active region 1. The terminal region 3 is provided so as to surround the active region 1 and the wiring region 2. The semiconductor substrate 10 in the terminal region 3 is provided with a structure to ensure the breakdown voltage of the semiconductor device. The semiconductor substrate 10 is formed of, for example, a semiconductor such as Si or a so-called wide bandgap semiconductor such as SiC or GaN.

The trench gates 20 are arranged in parallel to one another. The trench gates 20 extend only in the first direction on the front surface of the semiconductor substrate 10.

Hereinafter, in the description, the first direction indicates the horizontal direction in the plan views, and the second direction indicates the vertical direction in the plan views. Although eight trench gates 20 are illustrated as an example in FIG. 1, the number of trench gates 20 is not limited thereto. The trench gates 20 are provided across the active region 1 into the wiring region 2 on the front surface of the semiconductor substrate 10. That is, the trench gates 20 extend from the active region 1 to the wiring region 2, and the end portions of the trench gates 20 are located in the wiring region 2. Although the details will be described later, the trench gate 20 in the active region 1 forms part of the transistor.

The gate electrode 30 is provided in the wiring region 2. The gate electrode 30 in Embodiment 1 is also referred to as gate wiring and is provided so as to surround the active region 1. The gate electrode 30 is electrically connected to the end portions of the trench gates 20.

The gate pad 31 has a function as a terminal for connecting to external wiring. The gate pad 31 is electrically connected to the gate electrode 30.

The finger wiring portions 32 extend from the gate electrode 30 in the wiring region 2 to the active region 1. The finger wiring portions 32 are electrically connected to both the gate electrode 30 and the trench gates 20. Here, the finger wiring portions 32 extend in the second direction. The finger wiring portions 32 reduce the potential difference between the trench gates 20. Although, the finger wiring portions 32 are not inevitable for the semiconductor device according to Embodiment 1, they are preferably provided.

FIG. 2 is a plan view illustrating the configuration of the semiconductor device according to Embodiment 1 and is an enlarged view of a region P illustrated in FIG. 1. In the following description, n and p indicate the conductivity types of semiconductors. Further, $n^-$ indicates that the impurity concentration is lower than n, and $n^+$ indicates that the impurity concentration is higher than n. $p^+$ indicates that the impurity concentration is higher than p.

In the active region 1, an $n^+$ type emitter layer 11 and a p type base layer 12 are selectively arranged as the front surface layer of the semiconductor substrate 10. For example, the $n^+$ type emitter layer 11 and the p type base layer 12 are alternately arranged in the first direction. In the peripheral portion of the active region 1 in the Embodiment 1, the $n^+$ type emitter layer 11 and the p type base layer 12 are arranged in order from the inside to the outside of the active region 1. Although not illustrated, the p type base layer 12 may include a $p^+$ type contact layer on the front surface of the semiconductor substrate 10.

In the wiring region 2, a p type well layer 13 is arranged as the front surface layer of the semiconductor substrate 10. Here, the p type well layer 13 extends from the wiring region 2 to the peripheral portion of the active region 1 so as to be in contact with the p type base layer 12 of the peripheral portion of the active region 1.

As described above, the plurality of trench gates 20 extend from the active region 1 to the wiring region 2. The end portions of the trench gates 20 are located in the wiring region 2. The arrangement pitch, P1, for the plurality of trench gates 20 in the second direction is, for example, about 0.6 μm or more and 10.0 μm or less. The trench width, W11, in the active region 1 and the trench width, W12, in the wiring region 2 are, for example, about 0.5 μm or more and 1.5 μm or less. The trench width, W11, in Embodiment 1 is equal to the trench width, W12. The trench gate 20 includes a gate insulating film 21 and a gate conductive portion 22. The gate insulating film 21 is provided along the inner wall of the trench. The gate conductive portion 22 is provided inside the trench via the gate insulating film 21.

A gate contact portion 23 is provided at the end portion of the trench gate 20 in the wiring region 2. The gate contact portion 23 is formed on the gate conductive portion 22. The periphery of the gate contact portion 23 is surrounded by the gate conductive portion 22 in plan view. That is, the gate contact portion 23 is formed inside from the edge of the gate conductive portion 22. The gate contact portion 23 is provided at the opening of the interlayer insulating film described later. The width, W22, of the gate contact portion 23 is, for example, about 0.1 μm or more and 1.0 μm or less.

In the wiring region 2, the gate electrode 30 is provided so as to cover the gate contact portion 23 formed at the end portion of each trench gate 20. The gate electrode 30 is electrically connected to each trench gate 20 via the gate contact portions 23. For example, the gate electrode 30 is in contact with the gate conductive portions 22 at the gate contact portions 23. The gate pad 31 and the trench gates 20 are electrically connected to each other via the gate electrode 30 and the gate contact portions 23 in the wiring region 2.

Emitter contact portions 41 are provided in the active region 1. The emitter contact portion 41 is provided on at least the $n^+$ type emitter layer 11, and is electrically connected to the $n^+$ type emitter layer 11. The emitter contact portions 41 in Embodiment 1 are provided so as to come into contact with not only the $n^+$ type emitter layer 11 but also part of the surface of the p type base layer 12 and the p type well layer 13 in the active region 1. Here, the emitter contact portion 41 is provided between two trench gates 20 adjacent to each other. The emitter contact portions 41 extend in the first direction as with the trench gates 20. The emitter contact portions 41 are formed of, for example, metal. The width, W21, of the emitter contact portion 41 is, for example, about 0.1 μm or more and 1.0 μm or less.

The emitter electrode 40 is provided so as to cover the emitter contact portions 41 in the active region 1. The emitter electrode 40 is electrically connected to the $n^+$ type emitter layer 11 via the emitter contact portions 41.

Figure 3:
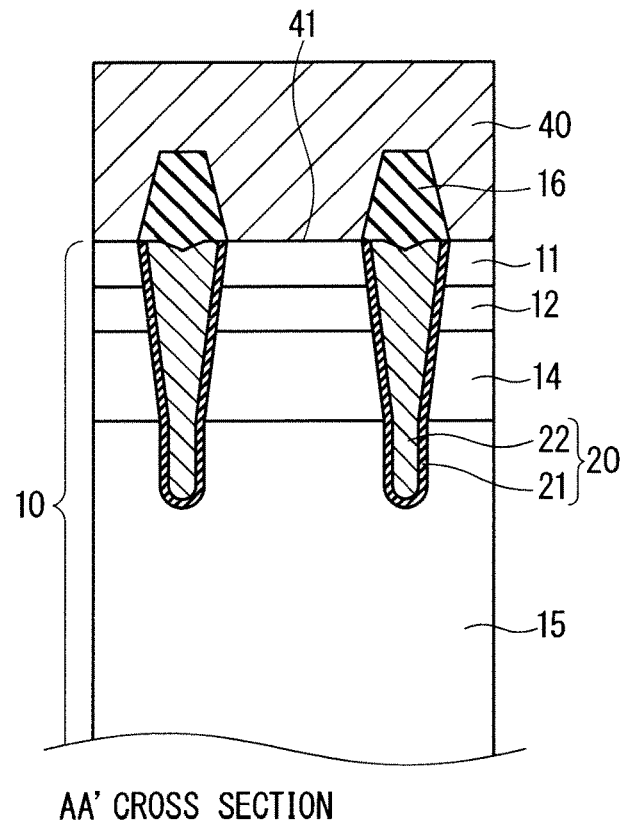
FIG. 3 is a cross-sectional view taken along line A-A' in FIG. 2.
Figure 4:
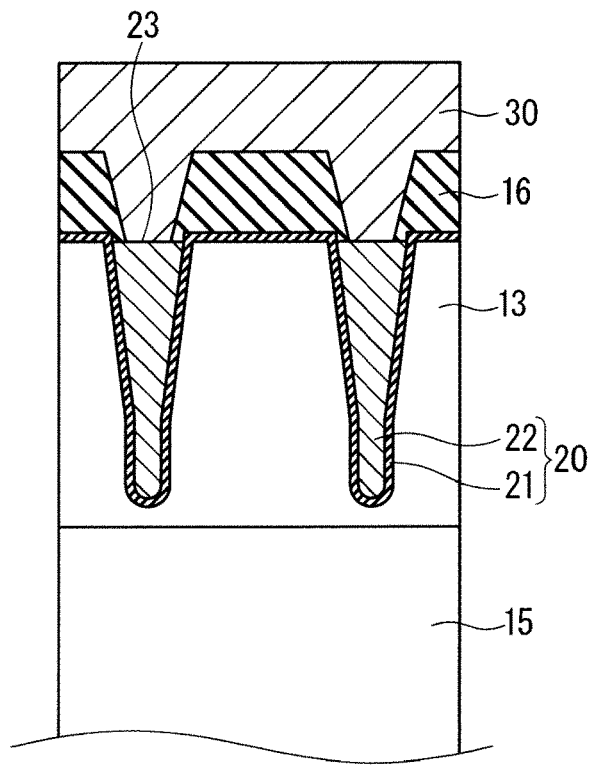
FIG. 4 is a cross-sectional view taken along line B-B' in FIG. 2.
Figure 5:
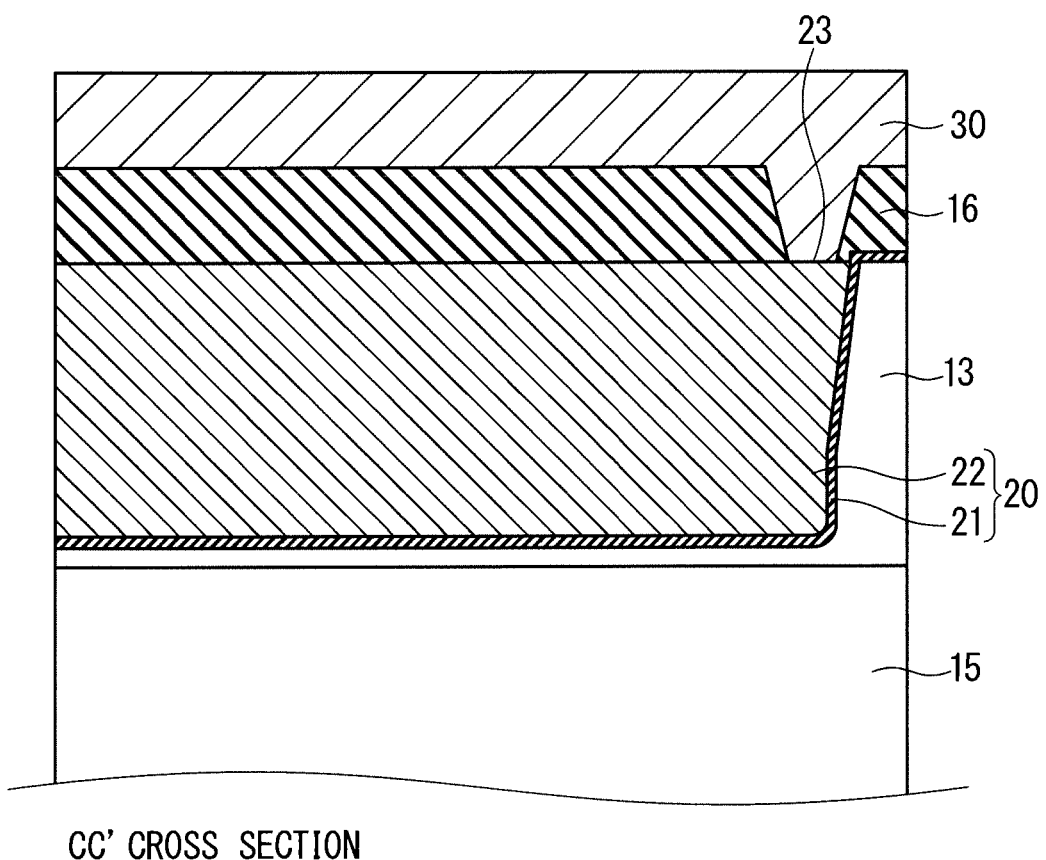
FIG. 5 is a cross-sectional view taken along line C-C' in FIG. 2.

FIG. 3 is a cross-sectional view taken along line A-A' in FIG. 2. FIG. 4 is a cross-sectional view taken along line B-B' in FIG. 2. FIG. 5 is a cross-sectional view taken along line C-C' in FIG. 2. In each cross-sectional view, the illustration of the structure on the rear surface side of the semiconductor substrate 10 is omitted.

As illustrated in FIG. 3, in the active region 1, the $n^+$ type emitter layer 11, the p type base layer 12, an n type carrier stored layer 14, and an $n^-$ type drift later 15 are provided in order from the front surface of the semiconductor substrate 10 in the depth direction. With respect to the front surface of the semiconductor substrate 10, the depth of the $n^+$ type emitter layer 11 is, for example, about 0.1 μm or more and 2.0 μm or less. The depth of the p type base layer 12 is, for example, about 0.5 μm or more and 3.0 μm or less. The depth of the n type carrier stored layer 14 is, for example, about 1.0 μm or more and 6.0 μm or less.

The trench gates 20 in the active region 1 extend through the $n^+$ type emitter layer 11, the p type base layer 12, and the n type carrier stored layer 14. The bottom portions of the trench gates 20 face the $n^-$ type drift layer 15. The depth of the trench gate 20 is, for example, about 0.5 μm or more and 10.0 μm or less with respect to the front surface of the semiconductor substrate 10.

In the active region 1, while the surfaces of the trench gates 20 are covered with an interlayer insulating film 16, parts of the surface of the $n^+$ type emitter layer 11 are not covered with the interlayer insulating film 16. The emitter contact portions 41 are formed in a region where the interlayer insulating film 16 is not provided.

The emitter electrode 40 is provided so as to cover the active region 1, for example. The emitter electrode 40 is electrically connected to the n+ type emitter layer 11 via the emitter contact portions 41.

As illustrated in FIGS. 4 and 5, in the wiring region 2, the p type well layer 13 and the n type drift layer 15 are provided in order from the front surface of the semiconductor substrate 10 in the depth direction. As illustrated in FIG. 5, the bottom portion of the end portion of the trench gate 20 in the wiring region 2 is covered with the well layer 13.

In the wiring region 2, the surface of the trench gate 20 other than the gate contact portion 23 is covered with the interlayer insulating film 16. The gate contact portion 23 is located in an opening provided in the interlayer insulating film 16. The gate electrode 30 is electrically connected to each trench gate 20 via the gate contact portion 23.

The transistor of Embodiment 1 includes the n+ type emitter layer 11, the p type base layer 12, the n type carrier stored layer 14, the n− type drift layer 15, the trench gate 20, the interlayer insulating film 16, and the emitter electrode 40 at least in the active region 1. As illustrated in FIG. 3, the side wall of the trench gate 20 in the active region 1, that is, the gate insulating film 21, is in contact with the n+ type emitter layer 11, the p type base layer 12, and the n type carrier stored layer 14. When a voltage is applied to the gate conductive portion 22 via the gate pad 31, the gate electrode 30, and the gate contact portion 23, a channel is formed in the p type base layer 12 in contact with the gate insulating film 21. A voltage to the gate conductive portion 22 for channel formation is applied via the gate pad 31, the gate electrode 30, and the gate contact portion 23 in the wiring region 2.

Summarizing the above, the semiconductor device according to Embodiment 1 includes the semiconductor substrate 10, the plurality of trench gates 20, and the gate electrode 30. The semiconductor substrate 10 includes the active region 1 in which the plurality of transistors are provided, and the wiring region 2 surrounding the active region 1 in plan view. The plurality of trench gates 20 extend from the active region 1 to the wiring region 2 on the front surface of the semiconductor substrate 10. The plurality of trench gates 20 form a part of the plurality of transistors in the active region 1. The gate electrode 30 is provided in the wiring region 2 and is electrically connected to the plurality of trench gates 20. The end portion of each of the plurality of trench gates 20 is located in the wiring region 2. The gate electrode 30 is provided so as to cover the gate contact portion 23 formed at the end portion of each of the plurality of trench gates 20. The gate electrode 30 is electrically connected to each of the trench gates 20 via the gate contact portions 23. The plurality of trench gates 20 extend only in one direction on the front surface of the semiconductor substrate 10.

In such a semiconductor device, the trench gates 20 in the active region 1 do not intersect each other. The trench width, W11, in the active region 1 is equal to the trench width, W12, in the wiring region 2. Therefore, there is no place where the trench widths, W11 and W12, change significantly. In the extending direction of the trench gates 20, the size of the trench opening does not significantly change, so that the micro-loading effect does not occur. As a result, in the extending direction of the trench gates 20, no portion where a significant change in depth in the trench is formed, and a trench having a substantially constant depth is formed. No level difference is formed at the bottom portion of the trench; therefore, the reliability of the gate insulating film 21 at the bottom portion of the trench improves.

Further, in the active region 1, the semiconductor substrate 10 according to Embodiment 1 includes a first conductivity type emitter layer 11 and a second conductivity type base layer 12, and the first conductivity type carrier stored layer 14 in the depth direction from the front surface of the semiconductor substrate 10. Also, the semiconductor substrate 10 includes the second conductivity type well layer 13 in the wiring region 2. The plurality of trench gates 20 in the active region 1 extend through the emitter layer 11, the base layer 12, and the carrier stored layer 14. The side walls of the plurality of trench gates 20 in the active region 1 is in contact with the n+ type emitter layer 11, the p-type base layer 12, and the n-type carrier stored layer 14. The bottom portion of the end portion of the trench gates 20 in the wiring region 2 is covered with the well layer 13. Although in Embodiment 1, an example has been described in which the first conductivity type represents n type and the second conductivity type represents p type, the first conductivity type may present p type and the second conductivity type may represent n type. The emitter layer 11 may be referred to as a source layer.

In such a semiconductor device, the well layer 13 covers the bottom portions of the end portions of the trench gates 20. Therefore, the reliability of the gate insulating film 21 at the end portions of the trenches improves, which leads to the improvement in the main breakdown voltage of the semiconductor device. Further, this exhibits an effect that the carrier stored layer 14 reduces the on-voltage.

Embodiment 2

A semiconductor device according to Embodiment 2 will be described. Embodiment 2 is a subordinate concept of Embodiment 1. In Embodiment 2, the same reference numerals are given to the similar components to those in Embodiment 1, and detailed description thereof will be omitted.

Figure 6:
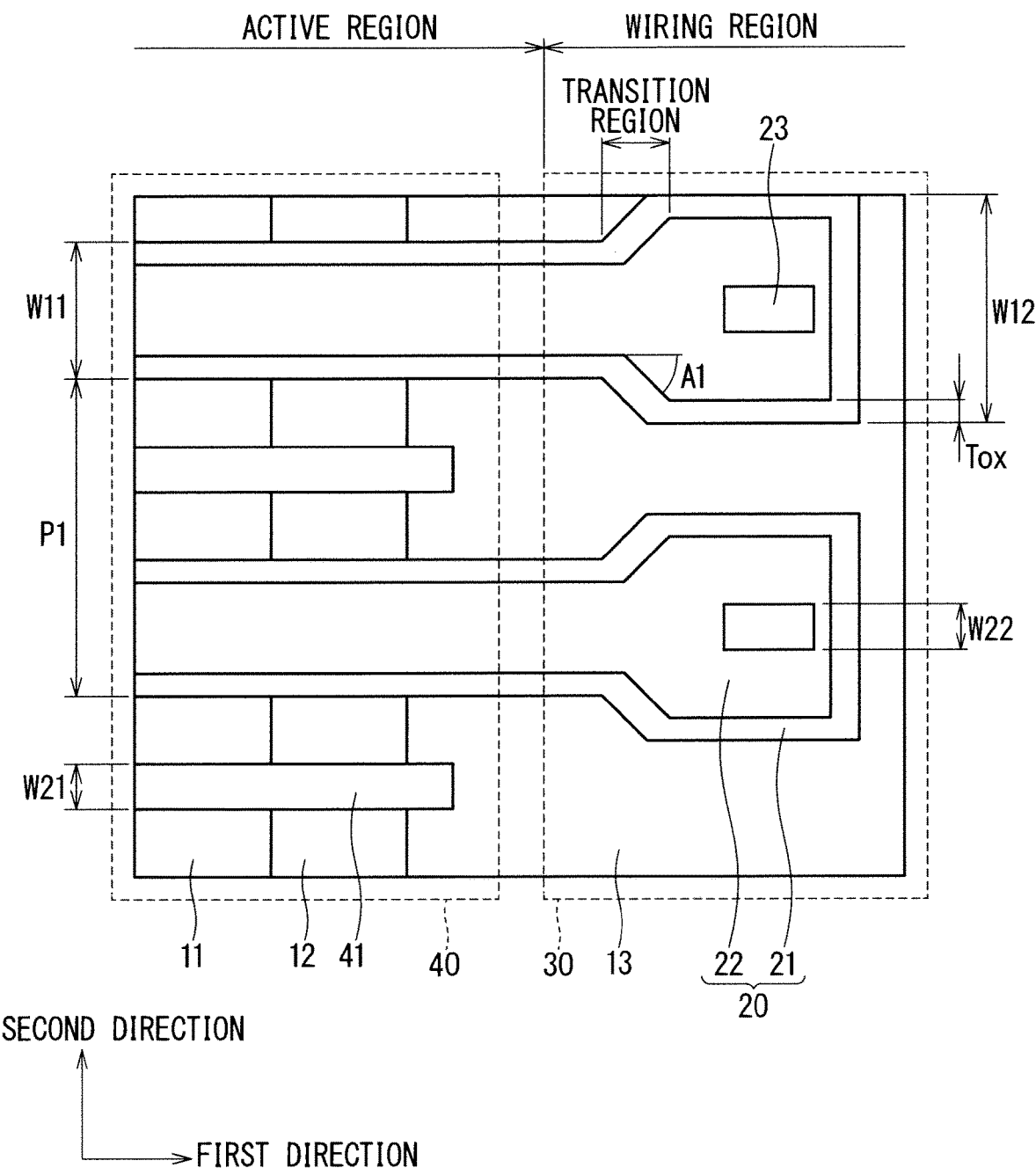
FIG. 6 is a plan view illustrating a configuration of a semiconductor device according to Embodiment 2.

FIG. 6 is a plan view illustrating a configuration of a semiconductor device according to Embodiment 2, and is an enlarged view of the region P illustrated in FIG. 1.

The trench width, W12, at the end portion of the trench gate 20 is greater than the trench width, W11, in the active region 1. The trench width, W12, in the wiring region 2 is, for example, 1.1 times or more and 2.0 times or less of the trench width, W11, in the active region 1. The thickness, Tox, of the gate insulating film 21 in the active region 1 and the wiring region 2 is constant.

The trench gate 20 has a transition region in which the trench width in the wiring region 2 gradually widens as it approaches the end portion thereof. The transition region is located on the side of the active region 1 with respect to the end portion of the trench gate 20 where the gate contact portion 23 is provided. The spread angle, A1, of the trench width in the transition region is less than 45 degrees with respect to the first direction which is the extending direction of the trench gate 20.

The effect exhibited with the trench width, W12, which is greater than the trench width, W11, will be explained. To prevent short circuits between the gate and the emitter, the gate contact portion 23 needs to be arranged inside the edge of the gate conductive portion 22. For the manufacturing of such a structure, a greater difference between the trench width, W12, and the width, W22, which is a width of the gate contact portion 23 in the wiring region 2 is preferable in consideration of robustness such as dimensional variation of each element and misalignment of each element. However, the smaller the width, W22, of the gate contact portion 23, the greater the contact resistance between the gate conductive portion 22 and the gate electrode 30 becomes, and thus the switching loss worsens. Therefore, the trench width, W12, is preferably larger. On the other hand, the greater the trench width, W11, in the active region 1, the greater the parasitic capacitance becomes, and the switching loss worsens.

The trench width, W12, in Embodiment 2 is greater than the trench width, W11.

With such a configuration, an increase in parasitic capacitance is prevented, and robustness to manufacturing variations improves.

The effect exhibited with the spread angle, A1, which is less than 45 degrees will be explained. Having the spread angle, A1, of less than 45 degrees makes the spreading of the trench width gradual in the transition region. In other words, no significantly widened portion in trench width appears. Therefore, a shape of the trench having a significant change in the trench depth due to the micro-loading effect is not formed. The change of the depth of the trench in Embodiment 2 is gradual. The formation of a level difference at the bottom portion of the trench is prevented. Therefore, the reliability of the gate insulating film 21 at the bottom portion of the trench improves.

In Embodiment 2, the example has been illustrated in which the trench width in the transition region changes linearly. However, a manner of change in trench width is not limited thereto. The spread of the trench width in the transition region may be curved. The planar shape of the trench gate 20 described above is controlled by the mask pattern in the manufacturing process.

Embodiment 3

A semiconductor device according to Embodiment 3 will be described. Embodiment 3 is a subordinate concept of Embodiment 1. In Embodiment 3, the same reference numerals are given to the similar components to those in Embodiment 1 or 2, and detailed description thereof will be omitted.

Figure 7:
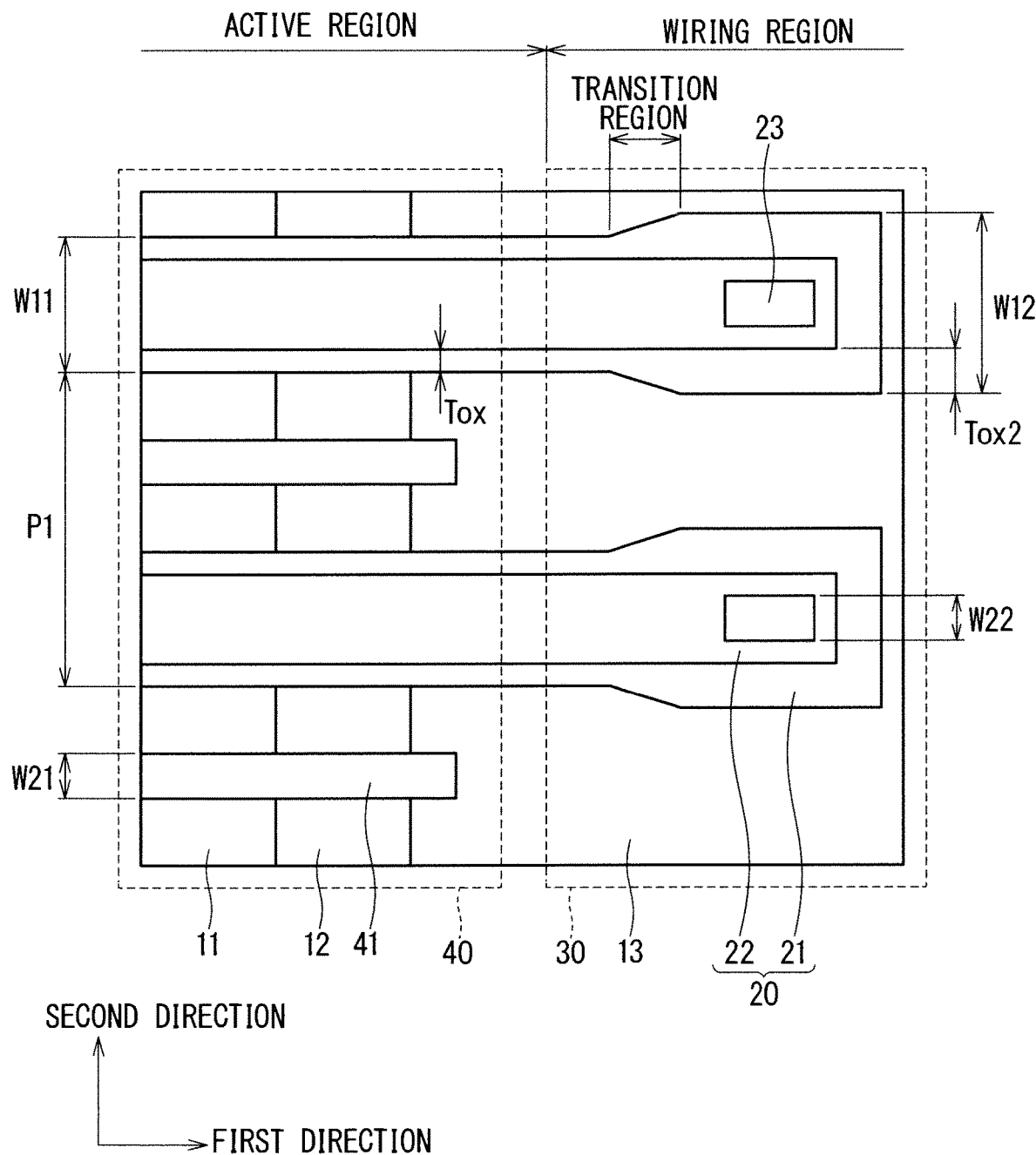
FIG. 7 is a plan view illustrating a configuration of a semiconductor device according to Embodiment 3.

FIG. 7 is a plan view illustrating a configuration of a semiconductor device according to Embodiment 3, and is an enlarged view of the region P illustrated in FIG. 1. As in the same with Embodiment 2, the trench width, W12, at the end portion of the trench gate 20 is greater than the trench width, W11, in the active region 1.

In Embodiment 3, the thickness, Tox2, of the gate insulating film 21 in the transition region and the end portion thereof is thicker than the thickness, Tox, of the gate insulating film 21 in the active region 1. The thickness, Tox, of the gate insulating film 21 is, for example, about 10 nm or more and 200 nm or less. The thickness, Tox2, of the gate insulating film 21 is, for example, about 1.1 times or more and 5.0 times or less the thickness, Tox, of the gate insulating film 21.

With such a configuration, the reliability of the gate insulating film 21 at the bottom portion of the trench improves.

The gate insulating film 21 in the wiring region 2 is formed, for example, by a process different from that of the gate insulating film 21 in the active region 1, such as oxidation, nitriding, a deposition treatment, or the like. Alternatively, the gate insulating film 21 in the wiring region 2 is formed, for example, by utilizing the effect of oxidation enhanced diffusion by the heat treatment such as oxidation, after arranging a high-concentration first conductivity type layer at the end portion of the trench.

Embodiment 4

A semiconductor device according to Embodiment 4 will be described. Embodiment 4 is a subordinate concept of Embodiment 1. In Embodiment 4, the same reference numerals are given to the similar components to those in any of Embodiments 1 to 3, and detailed description thereof will be omitted.

Figure 8:
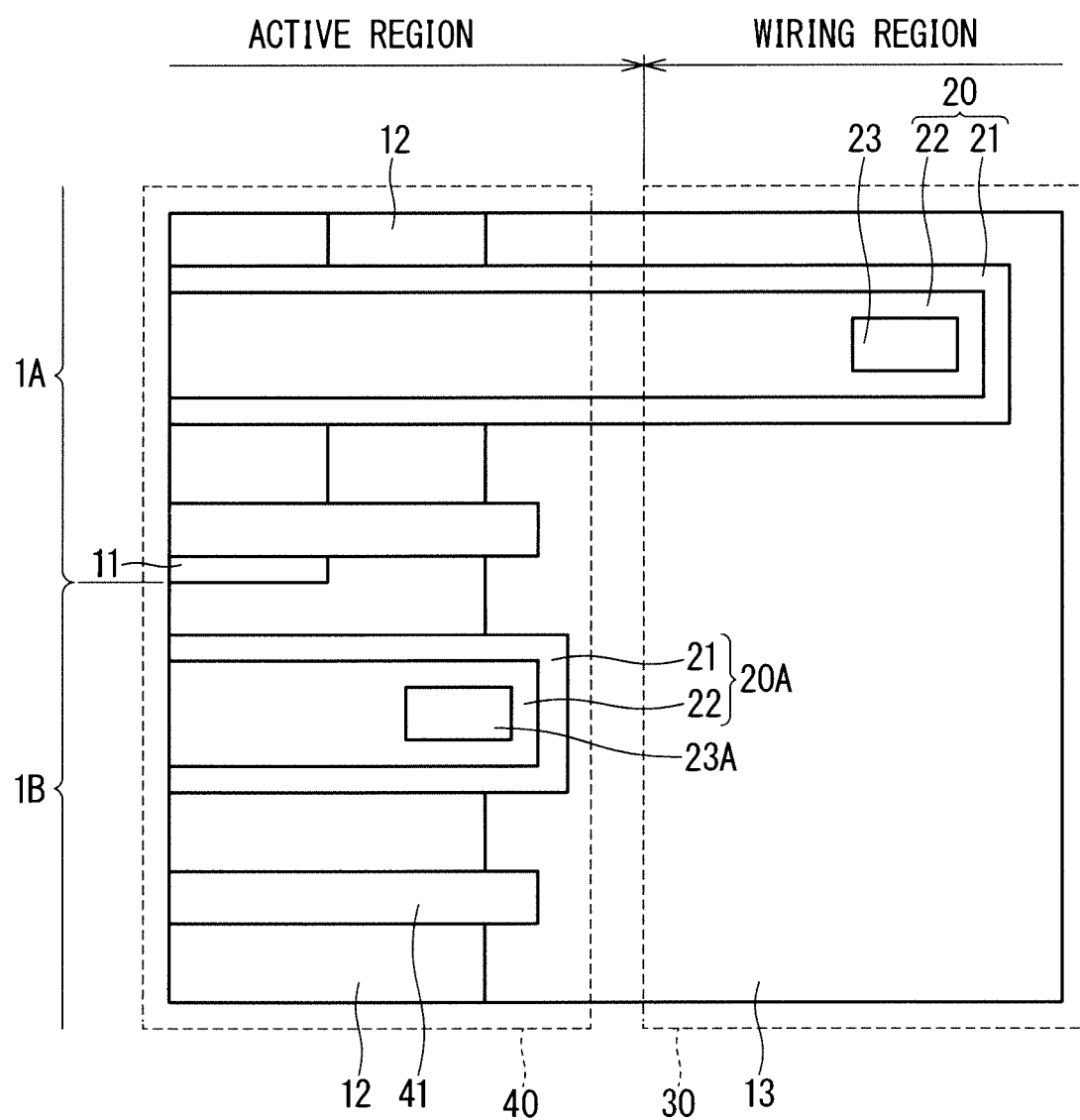
FIG. 8 is a plan view illustrating a configuration of a semiconductor device according to Embodiment 4.

FIG. 8 is a plan view illustrating a configuration of a semiconductor device according to Embodiment 4, and is an enlarged view of the region P illustrated in FIG. 1. The semiconductor substrate 10 includes a first active region 1A and a second active region 1B.

In the first active region 1A, the $n^+$ type emitter layer 11 and the p type base layer 12 are selectively arranged in the first direction as the front surface layer of the semiconductor substrate 10. Although the cross-sectional view is omitted, the $n^+$ type emitter layer 11, the p type base layer 12, the n type carrier stored layer 14, and the $n^-$ type drift layer 15 are in order from the front surface to the depth direction of the semiconductor substrate 10 in the first active region 1A.

In the second active region 1B, the $n^+$ type emitter layer 11 is not arranged and only the p type base layer 12 is arranged as the front surface layer of the semiconductor substrate 10. Although the cross-sectional view is omitted, the p type base layer 12, the n type carrier stored layer 14, and the $n^-$ drift layer 15 are in order from the front surface to the depth direction of the semiconductor substrate 10 in the second active region 1B.

The trench gate 20 extends from the first active region 1A to the wiring region 2. The trench gate 20 in the first active region 1A extends through the $n^+$ type emitter layer 11, the p type base layer 12, and the n type carrier stored layer 14. The gate insulating film 21 forming the side wall of the trench gate 20 is in contact with the $n^+$ type emitter layer 11, the p type base layer 12, and the n type carrier stored layer 14. When a voltage is applied to the gate conductive portion 22 via the gate pad 31, the gate electrode 30, and the gate contact portion 23, a channel is formed in the p type base layer 12 in contact with the gate insulating film 21.

The semiconductor device according to Embodiment 4 includes at least one dummy trench gate 20A apart from the trench gates 20. The dummy trench gate 20A is provided in the second active region 1B and extends in the first direction as with the trench gate 20. However, the dummy trench gate 20A does not extend into the wiring region 2, and the end portion of the dummy trench gate 20A is located in the second active region 1B. For example, the trench width and arrangement pitch of the dummy trench gate 20A are the same as the trench width and arrangement pitch of the trench gate 20, respectively. The trench gate 20 is also referred to as an active trench gate in contrast with the dummy trench gate 20A.

As with the trench gate 20, the dummy trench gate 20A includes the gate insulating film 21 and the gate conductive portion 22. The dummy trench gate 20A extends through the p type base layer 12 and the n type carrier stored layer 14. The gate insulating film 21 forming the side wall of the dummy trench gate 20A is not in contact with the $n^+$ type emitter layer 11, but is in contact with the p type base layer 12, and the n type carrier stored layer 14.

A dummy contact portion 23A is provided at the end portion of the dummy trench gate 20A in the second active region 1B. The dummy contact portion 23A is formed on the gate conductive portion 22 of the dummy trench gate 20A. The periphery of the dummy contact portion 23A is surrounded by the gate conductive portion 22 in plan view. That is, the dummy contact portion 23A is formed inside from the edge of the gate conductive portion 22.

The emitter electrode 40 is provided so as to cover the dummy contact portion 23A on the dummy trench gate 20A and the emitter contact portion 41 on the $n^+$ type emitter layer 11. The emitter electrode 40 is electrically connected to the dummy trench gate 20A via the dummy contact portion 23A. The emitter electrode 40 is electrically connected to the $n^+$ type emitter layer 11 via the emitter contact portion 41.

In this manner, the dummy trench gate 20A is connected to the emitter electrode 40. No channel is formed in the p type base layer 12 in contact with the gate insulating film 21. The replacement of a part of the trench gates 20 with the dummy trench gate 20A reduces the parasitic capacitance of the semiconductor device.

Embodiment 5

A semiconductor device according to Embodiment 5 will be described. Embodiment 5 is a subordinate concept of Embodiment 1. In Embodiment 5, the same reference numerals are given to the similar components to those in any of Embodiments 1 to 4, and detailed description thereof will be omitted.

Figure 9:
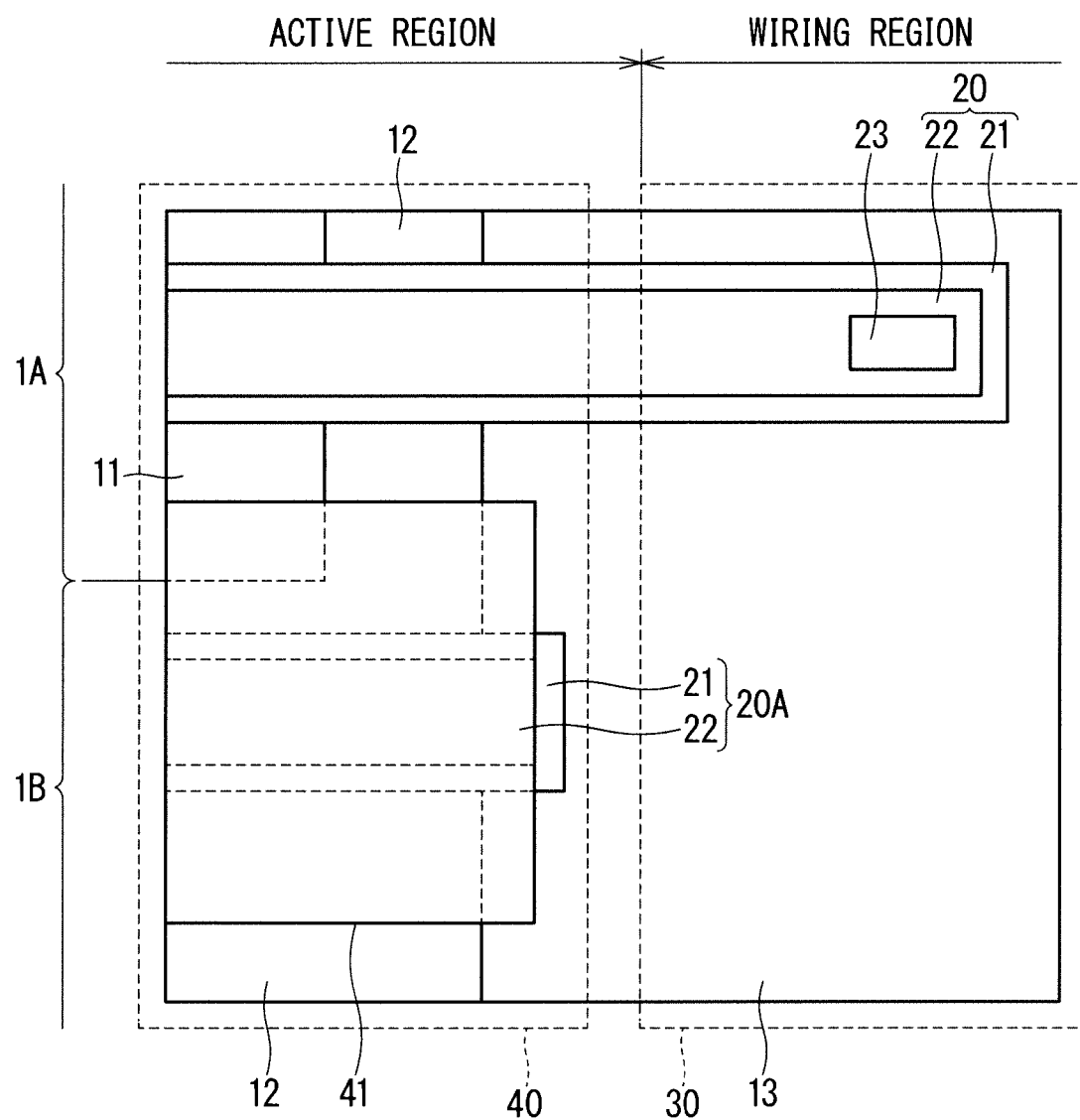
FIG. 9 is a plan view illustrating a configuration of a semiconductor device according to Embodiment 5.

FIG. 9 is a plan view illustrating a configuration of a semiconductor device according to Embodiment 5, and is an enlarged view of the region P illustrated in FIG. 1. The semiconductor device according to Embodiment 5 has a different connection configuration between the dummy trench gate 20A and the emitter electrode 40 from that of the semiconductor device according to Embodiment 4.

The emitter contact portion 41 in the second active region 1B is provided in a straddling manner over the dummy trench gate 20A. That is, the emitter contact portion 41 is provided on the dummy trench gate 20A and on the p type base layer 12 arranged on both sides of the dummy trench gate 20A. In Embodiment 5, the emitter contact portion 41 in the second active region 1B extends into the adjacent first active region 1A. In the first active region 1A, the emitter contact portion 41 is provided on the $n^+$ type emitter layer 11 and the p type base layer 12.

The emitter electrode 40 is provided in the active region 1 and is electrically connected to the dummy trench gate 20A and the $n^+$ type emitter layer 11 via the emitter contact portion 41.

With such a configuration, the width of the emitter contact portion 41 is widened, so that the burying property of the emitter contact portion 41 by the emitter electrode 40 is improved.

Embodiment 6

A semiconductor device according to Embodiment 6 will be described. Embodiment 6 is a subordinate concept of Embodiment 1. In Embodiment 6, the same reference numerals are given to the similar components to those in any of Embodiments 1 to 5, and detailed description thereof will be omitted.

Figure 10:
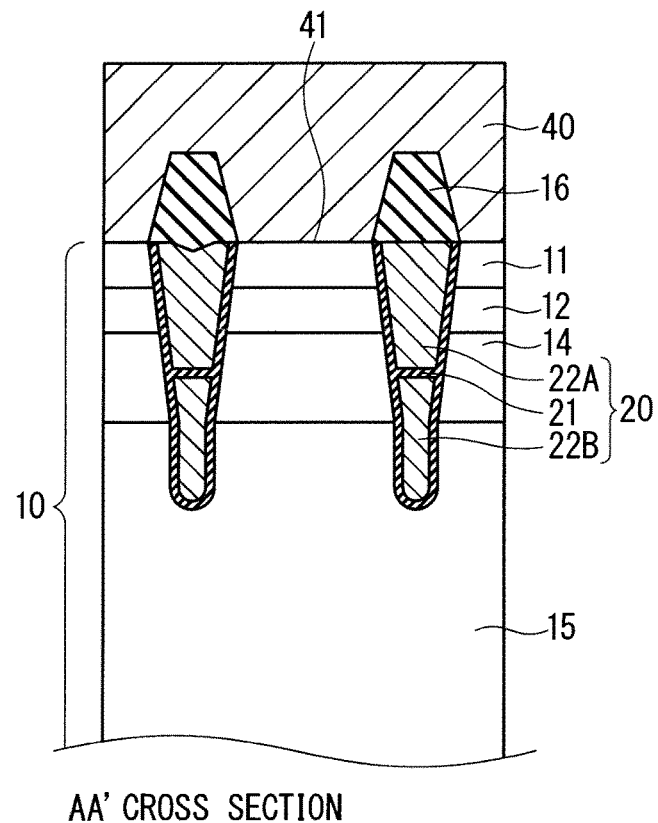
FIG. 10 is a cross-sectional view illustrating a configuration of a semiconductor device according to Embodiment 6 and is a cross-sectional view taken along line A-A' in FIG. 2.
Figure 11:
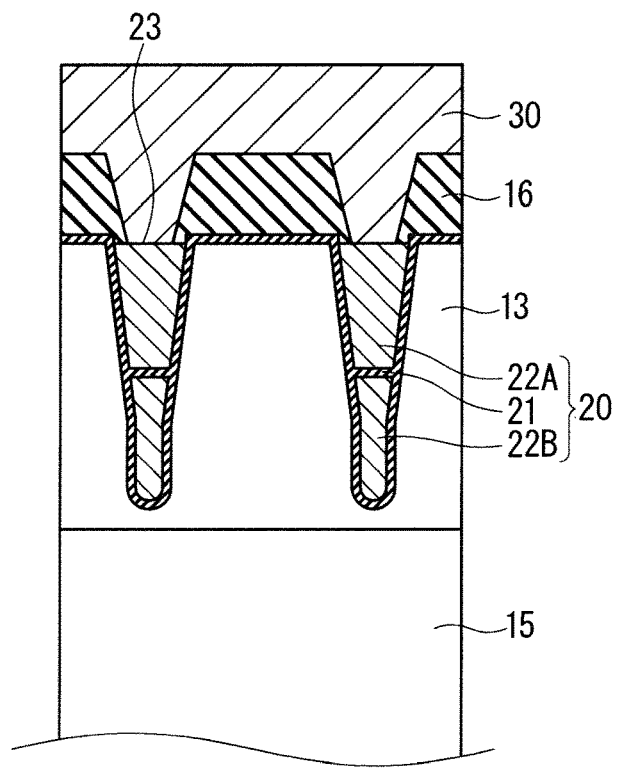
FIG. 11 is a cross-sectional view taken along line B-B' in FIG. 2.
Figure 12:
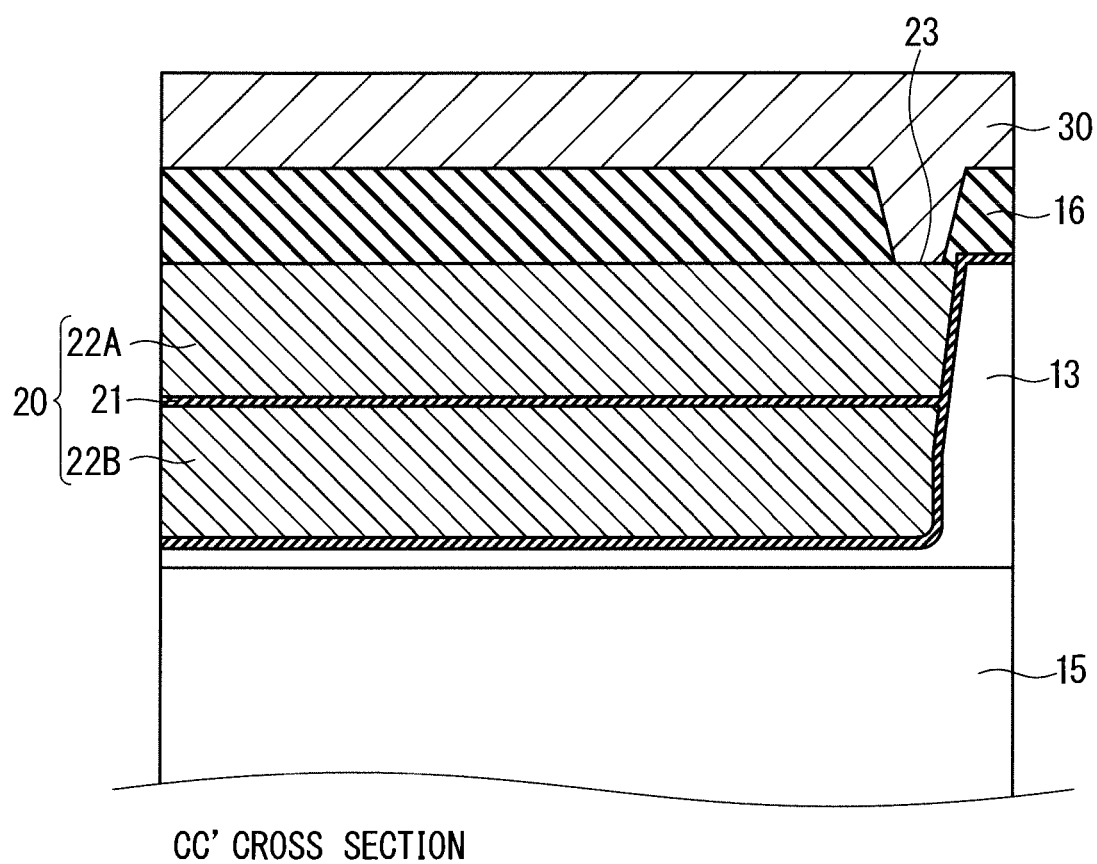
FIG. 12 is a cross-sectional view taken along line C-C' in FIG. 2.

The planar configuration of the semiconductor device according to Embodiment 6 is the same as the planar configuration of the semiconductor device according to Embodiment 1. That is, the planar configuration of the semiconductor device according to Embodiment 6 is the same as the configuration illustrated in FIG. 2. FIG. 10 is a cross-sectional view illustrating a configuration of the semiconductor device according to Embodiment 6 and is a cross-sectional view taken along line A-A' in FIG. 2. FIG. 11 is a cross-sectional view taken along line B-B' in FIG. 2. FIG. 12 is a cross-sectional view taken along line C-C' in FIG. 2.

As with Embodiment 1, the trench gates 20 in the active region 1 extend through the $n^+$ type emitter layer 11, the p type base layer 12, and the n type carrier stored layer 14. The side walls of the trench gates 20 are in contact with the $n^+$ type emitter layer 11, the p type base layer 12, and the n type carrier stored layer 14. The bottom portions of the trench gates 20 face the $n^-$ type drift layer 15.

The gate insulating film 21 of the trench gate 20 divides the gate conductive portion into a first gate conductive portion 22A as an upper portion thereof and a second gate conductive portion 22B as a lower portion thereof inside the trench.

The bottom portion of the first gate conductive portion 22A is located below the p type base layer 12. The bottom portion of the first gate conductive portion 22A is located below the boundary between the p type base layer 12 and the n type carrier stored layer 14. Here, the bottom portion of the first gate conductive portion 22A is located in the n type carrier stored layer 14.

The bottom portion of the second gate conductive portion 22B is located below the n type carrier stored layer 14. Here, the bottom portion of the second gate conductive portion 22B is located in the $n^-$ type drift later 15.

With such a configuration, the feedback capacitance of the trench gate 20 is reduced.

Embodiment 7

A semiconductor device according to Embodiment 7 will be described. Embodiment 7 is a subordinate concept of Embodiment 1. In Embodiment 7, the same reference numerals are given to the similar components to those in any of Embodiments 1 to 6, and detailed description thereof will be omitted.

Figure 13:
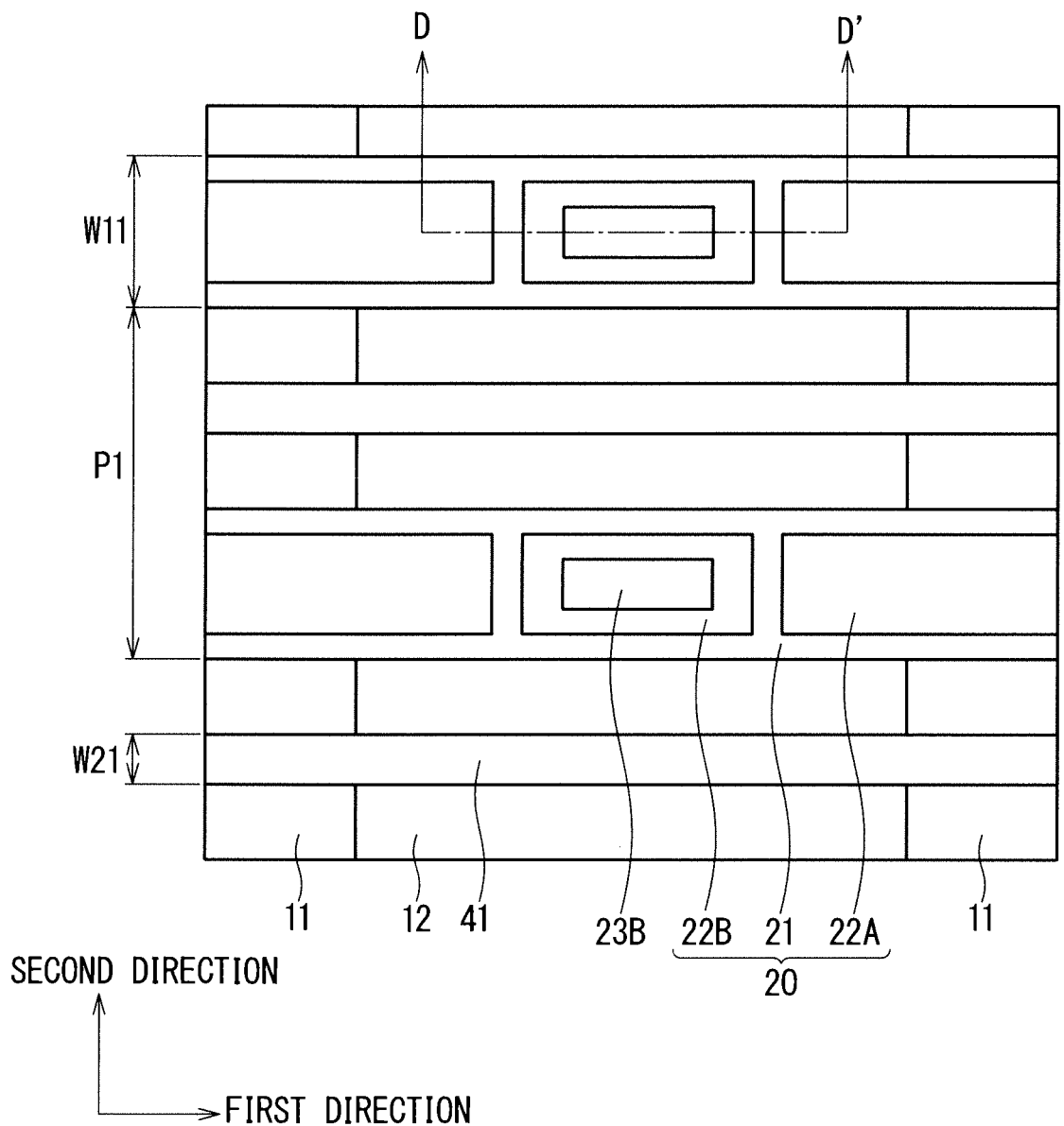
FIG. 13 is a plan view illustrating a configuration of a semiconductor device according to Embodiment 7.
Figure 14:
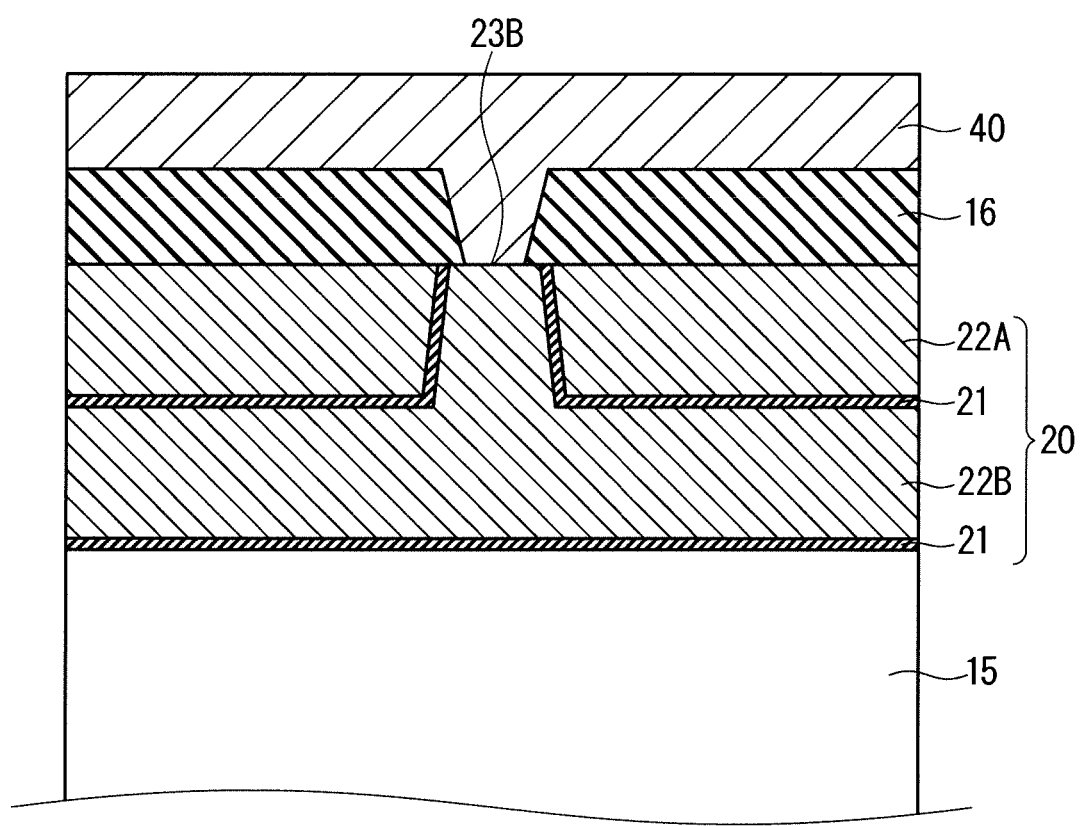
FIG. 14 is a cross-sectional view taken along line D-D' in FIG. 13.

FIG. 13 is a plan view illustrating a configuration of a semiconductor device according to Embodiment 7, and is an enlarged view of a region Q illustrated in FIG. 1. FIG. 14 is a cross-sectional view taken along line D-D' in FIG. 13.

As with Embodiment 6, the gate insulating film 21 of the trench gate 20 in the active region 1 divides the gate conductive portion into the first gate conductive portion 22A as the upper portion and the second gate conductive portion 22B as the lower portion inside the trench.

A part of the second gate conductive portion 22B in the active region 1 is exposed on the front surface of the semiconductor substrate 10. A shield contact portion 23B is provided on the part of the second gate conductive portion 22B exposed on the front surface of the semiconductor substrate 10. The periphery of the shield contact portion 23B is surrounded by the second gate conductive portion 22B in plan view. That is, the shield contact portion 23B is formed inside from the edge of the second gate conductive portion 22B.

In the active region 1, while the surface of the first gate conductive portion 22A is covered with the interlayer insulating film 16, the surface of the shield contact portion 23B is not covered with the interlayer insulating film 16. In other words, the shield contact portion 23B is formed in an opening of the interlayer insulating film 16.

As with Embodiment 1, the emitter contact portion 41 is provided between two trench gates 20 adjacent to each other and extends in the first direction.

The emitter electrode 40 is provided so as to cover the shield contact portion 23B and the emitter contact portion 41 on the $n^+$ type emitter layer 11. The emitter electrode 40 is electrically connected to the second gate conductive portion 22B via the shield contact portion 23B. The emitter electrode 40 is electrically connected to the $n^+$ type emitter layer 11 via the emitter contact portion 41.

With such a configuration, the potential of the second gate conductive portion 22B is stabilized.

Embodiment 8

A semiconductor device according to Embodiment 8 will be described. Embodiment 8 is a subordinate concept of Embodiment 1. In Embodiment 8, the same reference numerals are given to the similar components to those in any of Embodiments 1 to 7, and detailed description thereof will be omitted.

Figure 15:
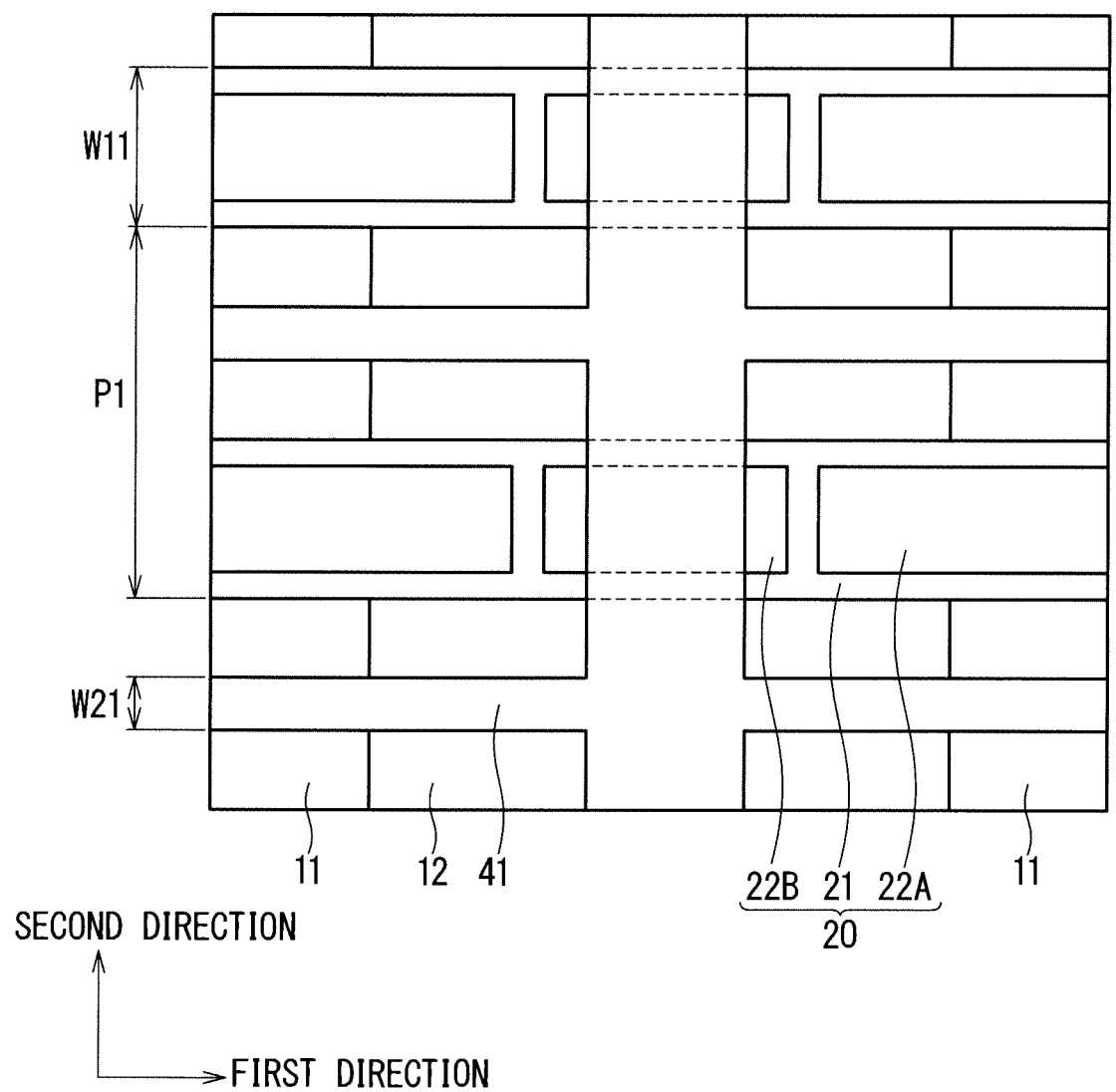
FIG. 15 is a plan view illustrating a configuration of a semiconductor device according to Embodiment 8.

FIG. 15 is a plan view illustrating a configuration of a semiconductor device according to Embodiment 8, and is an enlarged view of the region Q illustrated in FIG. 1. The configuration of the trench gate 20 in Embodiment 8 is the same as the configuration of the trench gate 20 in Embodiment 7. In Embodiment 8, the connection configuration between the emitter electrode 40 and the second gate conductive portion 22B is different from that of Embodiment 7.

As with Embodiment 1, the emitter contact portion 41 is provided between two trench gates 20 adjacent to each other and extends in the first direction. Further, the emitter contact portion 41 is provided in a straddling manner over the second gate conductive portion 22B exposed on the front surface of the semiconductor substrate 10. That is, the emitter contact portion 41 is also provided on the second gate conductive portion 22B exposed on the front surface of the semiconductor substrate 10, and extends in the second direction as well. Such an emitter contact portion 41 has, for example, a lattice shape.

The emitter electrode 40 is provided so as to cover the emitter contact portions 41. The emitter electrode 40 is electrically connected to the second gate conductive portion 22B and the $n^+$ type emitter layer 11 via the emitter contact portion 41.

With such a configuration, contact formation between the emitter electrode 40 and the second gate conductive portion 22B is facilitated.

The plurality of trench gates 20 illustrated above are a part of the components of the transistors formed in the active region 1. Although in each Embodiment, an IGBT is described as an example of the transistor, the same effect can be obtained when the transistor is a Metal-Oxide-Semiconductor Field Effect Transistor (MOSFET).

The same effect is obtained even when the structure of the trench gate 20 described in each Embodiment is applied only to a part of the region of the semiconductor substrate 10.

When the semiconductor device is a Reverse Conducting IGBT (RC-IGBT), an IGBT element included in the RC-IGBT corresponds to the above transistor. That is, the trench gate 20 may be a component of the IGBT element included in the RC-IGBT. The RC-IGBT is a semiconductor device in which an IGBT region including an IGBT element and a diode region including a diode element are selectively formed in one semiconductor substrate 10. When the semiconductor device is an RC-IGBT, the above-mentioned active region 1 is a region including the IGBT region and the diode region. In particular, when the structure of the trench gate 20 described in each Embodiment is applied to the boundary between the IGBT region and the wiring region 2, the same effect as described above is obtained.

Regarding the type of the semiconductor substrate 10, the effect of each Embodiment is obtained regardless of the type of the substrate such as an FZ substrate, an MCZ substrate, and an epi substrate. Further, the effect of each Embodiment is obtained regardless of the breakdown voltage class of the semiconductor substrate 10 or the semiconductor device.

It should be noted that Embodiments of the present disclosure can be arbitrarily combined and can be appropriately modified or omitted without departing from the scope of the invention.

While the disclosure has been described in detail, the forgoing description is in all aspects illustrative and not restrictive. It is therefore understood that numerous modifications and variations can be devised without departing from the scope of the invention.

What is claimed is:

1. A semiconductor device comprising:
a semiconductor substrate including an active region in which a plurality of transistors are provided and a wiring region surrounding the active region in plan view;
a plurality of trench gates extending from the active region to the wiring region on a front surface of the semiconductor substrate and forming a part of the plurality of transistors in the active region; and
a gate electrode provided in the wiring region and electrically connected to the plurality of trench gates, wherein
an end portion of each of the plurality of trench gates is located in the wiring region,
the gate electrode is provided so as to cover a gate contact portion formed at the end portion of each of the plurality of trench gates, and electrically connected to each of the plurality of trench gates via the gate contact portion,
the plurality of trench gates extend only in one direction on the front surface of the semiconductor substrate,
a trench width at the end portion of each of the plurality of trench gates is greater than a trench width in the active region,
each of the trench gates has a transition region in which the trench width in the wiring region gradually widens as it approaches the end portion thereof, and
a spread angle of the trench width in the transition region is less than 45 degrees with respect to the one direction which is an extending direction of the plurality of trench gates.

2. The semiconductor device according to claim 1, wherein
each of the plurality of trench gates includes:
a gate insulating film provided along an inner wall of a trench formed in the semiconductor substrate; and
a gate conductive portion provided inside the trench via the gate insulating film, the gate contact portion is formed on the gate conductive portion, and
a thickness of the gate insulating film in the transition region and at the end portion is thicker than a thickness of the gate insulating film in the active region.

3. The semiconductor device according to claim 1, wherein
the plurality of transistors include a plurality of insulated gate bipolar transistors.

4. The semiconductor device according to claim 1, wherein
each of the plurality of trench gates includes a gate insulating film provided along an inner wall of a trench formed in the semiconductor substrate, and
a thickness of the gate insulating film at the end portion is thicker than a thickness of the gate insulating film in the active region.

5. A semiconductor device, comprising:
a semiconductor substrate including an active region in which a plurality of transistors are provided and a wiring region surrounding the active region in plan view;
a plurality of trench gates extending from the active region to the wiring region on a front surface of the semiconductor substrate and forming a part of the plurality of transistors in the active region;
a gate electrode provided in the wiring region and electrically connected to the plurality of trench gates;
at least one dummy trench gate provided in the active region on the front surface of the semiconductor substrate; and
an emitter electrode provided in the active region, wherein,
an end portion of each of the plurality of trench gates is located in the wiring region,
the gate electrode is provided so as to cover a gate contact portion formed at the end portion of each of the plurality of trench gates, and electrically connected to each of the plurality of trench gates via the gate contact portion,
the plurality of trench gates extend only in one direction on the front surface of the semiconductor substrate
in the active region, the semiconductor substrate includes:
a first active region in which an emitter layer of a first conductivity type and a base layer of a second conductivity type are selectively arranged, on the front surface of the semiconductor substrate, in the one direction which is an extending direction of the plurality of trench gates; and
a second active region in which the emitter layer is not arranged but the base layer is arranged on the front surface of the semiconductor substrate,
the emitter layer and the base layer are provided in a depth direction from the front surface of the semiconductor substrate in the first active region,
the emitter layer is not provided but the base layer is provided in the depth direction from the front surface of the semiconductor substrate in the second active region,
the plurality of trench gates are provided in the first active region and extend through the emitter layer and the base layer,
side walls of the plurality of trench gates are in contact with the emitter layer and the base layer,
the at least one dummy trench gate is provided in the second active region and extends through the base layer,
a side wall of the at least one dummy trench gate is not in contact with the emitter layer but is in contact with the base layer,
the emitter electrode is provided so as to cover a dummy contact portion formed at an end portion of the at least one dummy trench gate and an emitter contact portion formed on the emitter layer, and
the emitter electrode is electrically connected to the at least one dummy trench gate via the dummy contact portion and electrically connected to the emitter layer via the emitter contact portion.

6. The semiconductor device according to claim 5, wherein
the plurality of transistors include a plurality of insulated gate bipolar transistors.

7. A semiconductor device, comprising:
a semiconductor substrate including an active region in which a plurality of transistors are provided and a wiring region surrounding the active region in plan view;
a plurality of trench gates extending from the active region to the wiring region on a front surface of the semiconductor substrate and forming a part of the plurality of transistors in the active region;
a gate electrode provided in the wiring region and electrically connected to the plurality of trench gates;
at least one dummy trench gate provided in the active region on the front surface of the semiconductor substrate; and
an emitter electrode provided in the active region, wherein
an end portion of each of the plurality of trench gates is located in the wiring region,
the gate electrode is provided so as to cover a gate contact portion formed at the end portion of each of the plurality of trench gates, and electrically connected to each of the plurality of trench gates via the gate contact portion,
the plurality of trench gates extend only in one direction on the front surface of the semiconductor substrate
in the active region, the semiconductor substrate includes:
a first active region in which an emitter layer of a first conductivity type and a base layer of a second conductivity type are selectively arranged, on the front surface of the semiconductor substrate, in the one direction which is an extending direction of the plurality of trench gates; and
a second active region in which the emitter layer is not arranged but the base layer is arranged on the front surface of the semiconductor substrate,
the emitter layer and the base layer are provided in a depth direction from the front surface of the semiconductor substrate in the first active region,
the emitter layer is not provided but the base layer is provided in the depth direction from the front surface of the semiconductor substrate in the second active region,
the plurality of trench gates are provided in the first active region and extend through the emitter layer and the base layer,
side walls of the plurality of trench gates are in contact with the emitter layer and the base layer,
the at least one dummy trench gate is provided in the second active region and extends through the base layer,
a side wall of the at least one dummy trench gate is not in contact with the emitter layer but is in contact with the base layer, and
the emitter electrode is provided so as to cover an emitter contact portion formed on the at least one dummy trench gate and the emitter layer, and electrically connected to the at least one dummy trench gate and the emitter layer via the emitter contact portion.

8. The semiconductor device according to claim 7, wherein
the plurality of transistors include a plurality of insulated gate bipolar transistors.

9. A semiconductor device, comprising:
a semiconductor substrate including an active region in which a plurality of transistors are provided and a wiring region surrounding the active region in plan view;
a plurality of trench gates extending from the active region to the wiring region on a front surface of the semiconductor substrate and forming a part of the plurality of transistors in the active region; and
a gate electrode provided in the wiring region and electrically connected to the plurality of trench gates, wherein
an end portion of each of the plurality of trench gates is located in the wiring region,
the gate electrode is provided so as to cover a gate contact portion formed at the end portion of each of the plurality of trench gates, and electrically connected to each of the plurality of trench gates via the gate contact portion,
the plurality of trench gates extend only in one direction on the front surface of the semiconductor substrate,
the semiconductor substrate includes:
an emitter layer of a first conductivity type, a base layer of a second conductivity type, and a carrier stored layer of the first conductivity type in a depth direction from the front surface of the semiconductor substrate in the active region; and
a well layer of the second conductivity type in the wiring region,
the plurality of trench gates in the active region extend through the emitter layer, the base layer, and the carrier stored layer,
side walls of the plurality of trench gates in the active region are in contact with the emitter layer, the base layer, and the carrier stored layer, and
a bottom portion of the end portion of each of the plurality of trench gates is covered with the well layer.

10. The semiconductor device according to claim 9, wherein
the plurality of transistors include a plurality of insulated gate bipolar transistors.

11. A semiconductor device, comprising:
a semiconductor substrate including an active region in which a plurality of transistors are provided and a wiring region surrounding the active region in plan view;
a plurality of trench gates extending from the active region to the wiring region on a front surface of the semiconductor substrate and forming a part of the plurality of transistors in the active region; and
a gate electrode provided in the wiring region and electrically connected to the plurality of trench gates, wherein
an end portion of each of the plurality of trench gates is located in the wiring region,
the gate electrode is provided so as to cover a gate contact portion formed at the end portion of each of the plurality of trench gates, and electrically connected to each of the plurality of trench gates via the gate contact portion,
the plurality of trench gates extend only in one direction on the front surface of the semiconductor substrate,
the semiconductor substrate includes an emitter layer of a first conductivity type, a base layer of a second conductivity type, and a carrier stored layer of the first conductivity type in a depth direction from the front surface of the semiconductor substrate in the active region,
the plurality of trench gates in the active region extend through the emitter layer, the base layer, and the carrier stored layer,
side walls of the plurality of trench gates in the active region are in contact with the emitter layer, the base layer, and the carrier stored layer,
each of the plurality of trench gates in the active region includes:
a gate insulating film provided along an inner wall of a trench formed in the semiconductor substrate and in contact with the emitter layer, the base layer, and the carrier stored layer; and
a gate conductive portion provided inside the trench via the gate insulating film,
the gate insulating film divides the gate conductive portion into a first gate conductive portion as an upper portion of the gate conductive portion and a second gate conductive portion as a lower portion of the gate conductive portion inside the trench,
a bottom portion of the first gate conductive portion is located below the base layer, and
a bottom portion of the second gate conductive portion is located below the carrier stored layer.

12. The semiconductor device according to claim 11, further comprising
an emitter electrode provided in the active region, wherein,
a part of the second gate conductive portion in the active region is exposed on the front surface of the semiconductor substrate,
the emitter electrode is provided so as to cover a shield contact portion formed at the part of the second gate conductive portion and an emitter contact portion formed on the emitter layer, and
the emitter electrode is electrically connected to the second gate conductive portion via the shield contact portion and electrically connected to the emitter layer via the emitter contact portion.

13. The semiconductor device according to claim 11, further comprising
an emitter electrode provided in the active region, wherein,
a part of the second gate conductive portion in the active region is exposed on the front surface of the semiconductor substrate, and
the emitter electrode is provided so as to cover an emitter contact portion formed on the part of the second gate conductive portion and the emitter layer, and electrically connected to the second gate conductive portion and the emitter layer via the emitter contact portion.

14. The semiconductor device according to claim 11, wherein
the plurality of transistors include a plurality of insulated gate bipolar transistors.

* * * * *